(12) United States Patent
Yoshizawa (10) Patent No.: US 6,437,722 B1
(45) Date of Patent: Aug. 20, 2002

(54) AD CONVERTER CIRCUIT (75) Inventor: Hirokazu Yoshizawa, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/698,686

(22) Filed: Oct. 27, 2000

(51) Int. Cl.[7] ............................................... H03M 1/36
(52) U.S. Cl. ........................................ 341/154; 341/155
(58) Field of Search ................................. 341/155, 154, 341/161, 158

(56) References Cited

U.S. PATENT DOCUMENTS 4,396,907 A * 8/1983 Wintzer et al. ............. 341/154

* cited by examiner

Primary Examiner—Brian Young
(74) Attorney, Agent, or Firm—Adams & Wilks (57) ABSTRACT In a pipeline A/D converter circuit, the time at which outputs of MDACs of the A/D converter circuit change is shifted at respective stages, so that a cumulative error is avoided. In a resistance ladder circuit for supplying reference voltages to sub-A/D converter circuits of the pipeline A/D converter circuit, main resistors and auxiliary resistors are alternately connected in series to prepare the reference voltages, and the reference voltage supplied to the first stage MDAC is made different from the reference voltage supplied to the second and subsequent stage MDACs. In an embodiment, the auxiliary resistors have a resistance value of no more than one-half that of the main resistors to provide the offset.

20 Claims, 10 Drawing Sheets

AD CONVERTER CIRCUIT

BACKGROUND OF THE INVENTION

1. Field of the Invention

The present invention relates to a pipeline A/D converter circuit in which a low bit sub-A/D converter and sub-D/A converter comprise one block and a plurality of such blocks are cascaded, and to a structure of a resistance ladder network used in the circuit.

2. Description of the Related Art

Conventionally, there has been reported a structure of a pipeline A/D converter circuit in which a low bit sub-A/D converter and sub-D/A converter comprise one block and a plurality of such blocks are cascaded. For example, a document 1: Lewis, S. H., and Gray, P. R., "A pipelined 5-Msample/s 9-bit Analog-to-Digital Converter," Proceedings of IEEE International Symposium on Circuits and Systems, pp.954–961, 1987 discloses a pipeline A/D converter circuit.

Figure 8:
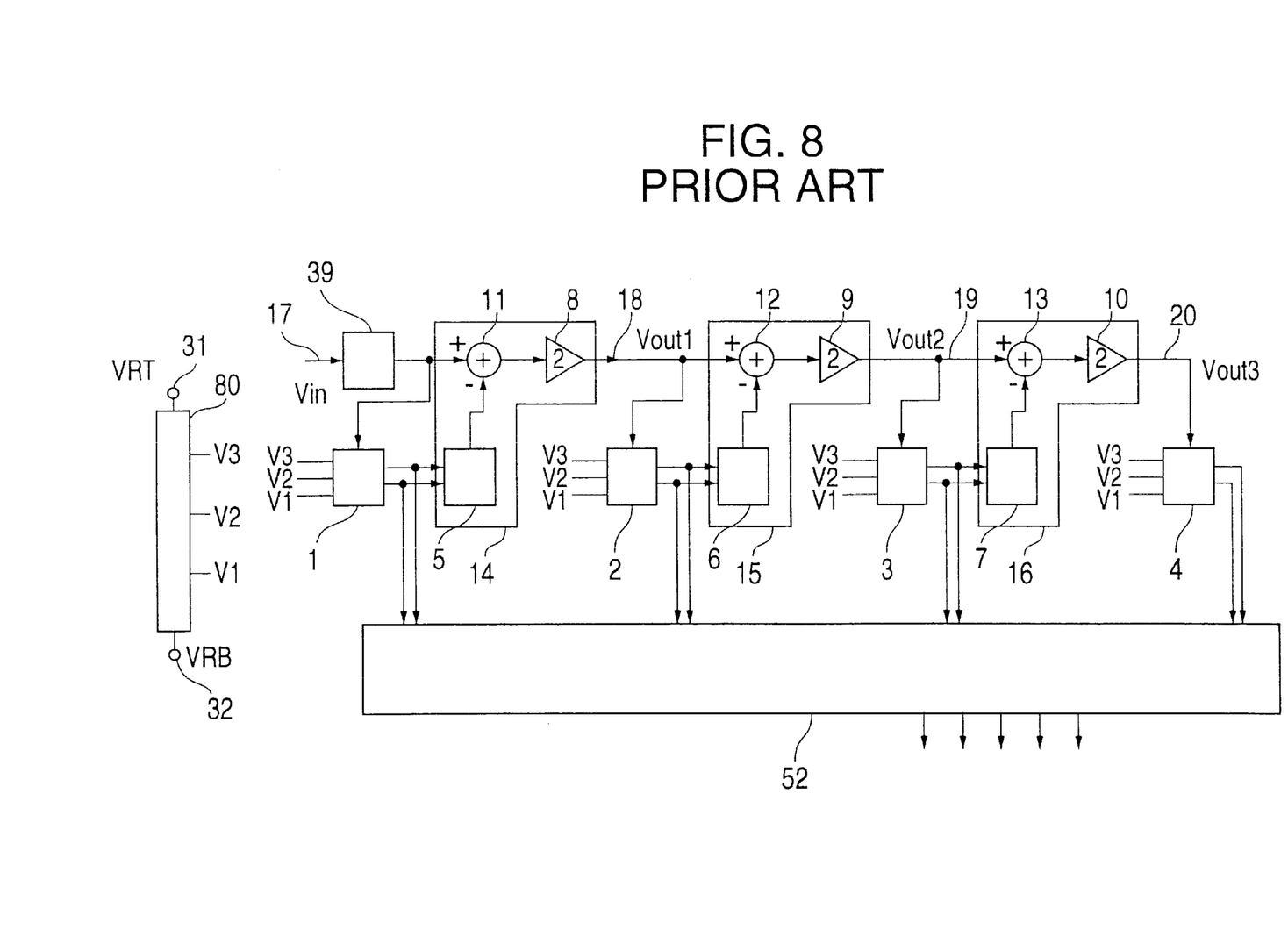
FIG. 8 is a structural view of a conventional pipeline A/D converter circuit.
Figure 9:
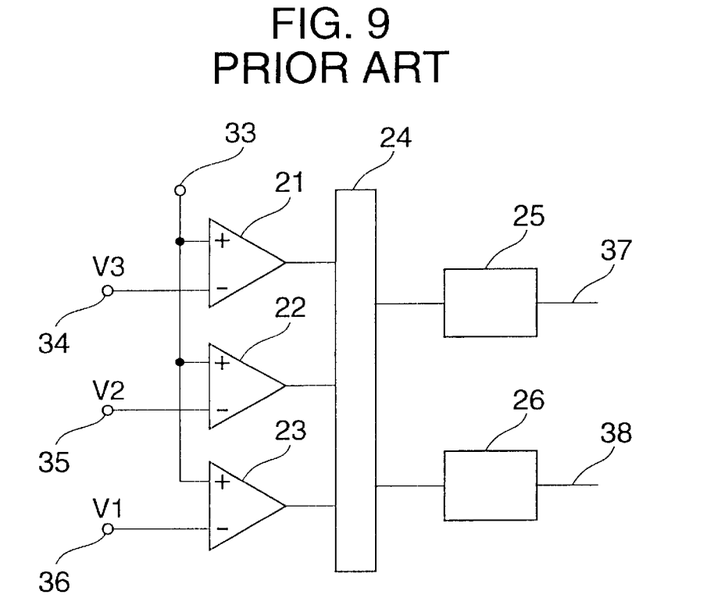
FIG. 9 is a structural view of a sub-A/D converter circuit used for the pipeline A/D converter circuit.
Figure 10:
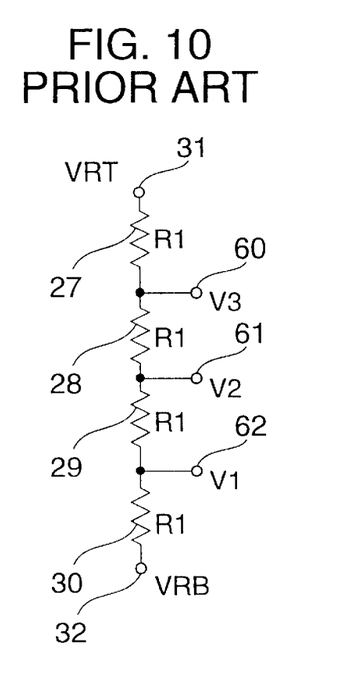
FIG. 10 is a structural view of a conventional resistance ladder circuit.

FIG. 8 shows an example of a circuit structure of a conventional pipeline A/D converter circuit. FIG. 9 shows an example of a structure of a sub-A/D converter used in each block. Further, FIG. 10 shows an example of a conventional structure of a resistance ladder for producing a reference voltage of a corresponding to the respective comparators, and then, inputs its output to an encoder 24. The output of the encoder 24 is outputted from sub-A/D converter circuit output terminals 37 and 38 through latches 25 and 26.

Figure 11A:
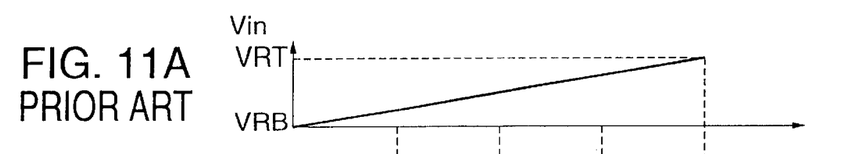
FIGS. 11A to 11D are timing charts showing output voltages of MDACs of respective stages in the pipeline A/D converter circuit using the conventional resistance ladder circuit and an input voltage to the A/D converter circuit.
Figure 11B:
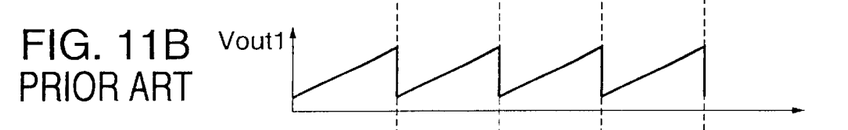

This output is inputted to a sub-D/A converter circuit 5 of FIG. 8, and is converted into an analog voltage equivalent to 2-bit digital data, and then, the voltage is subtracted from the output signal of the sample-and-hold circuit 39 in an adding circuit 11. The output of the adding circuit 11 is amplified twice by an amplifying circuit 8, and is inputted to the second stage sub-A/D converter circuit 2 and a second stage MDAC 15 from an MDAC output terminal 18. A signal waveform vout1 at the MDAC output terminal 18 is shown in FIG. 11B.

Figure 11C:
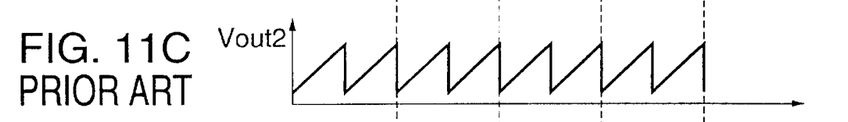

The signal input to the second stage sub-A/D converter circuit 2 and the second stage MDAC 15 from the MDAC output terminal 18 is processed in the same procedure as the first stage, and is input to the third stage sub-A/D converter circuit and a third stage MDAC 16. A signal waveform vout2 at an MDAC output terminal 19 is shown in FIG. 11C. An interval between V1 and V2 or between V2 and V3 is halved since the gain of the amplifying circuit 8 of the former stage MDAC 14 is twice. Here, attention should be paid to the fact that a changing point of a saw tooth wave of the waveform vout1 shown in FIG. 11B is just coincident with a changing point of a saw tooth wave of the waveform vout2 shown in FIG. 11C.

Figure 11D:
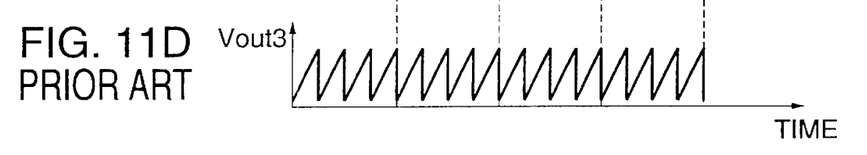

The signal input to the third stage sub-A/D converter circuit 3 and the third stage MDAC 16 from the MDAC output terminal 19 is processed in the same procedure as the first stage and is input to the fourth stage sub-A/D converter circuit 4. A signal waveform vout3 at an MDAC output terminal 20 is shown in FIG. 11D. Here, attention should be paid to the fact that the changing point of the saw tooth wave of the waveform vout1 shown in FIG. 11B, the changing point of the saw tooth wave of the waveform vout2 shown in FIG. 11C, and the changing point of the saw tooth wave of the waveform vout3 shown in FIG. 11D are all coincident with each other.

The outputs of the sub-A/D converter circuits 1, 2, 3 and 4 of the respective stages pass through a digital correction circuit 52, and then, are taken out as the output of this A/D converter circuit.

However, in the conventional pipeline A/D converter circuit, since the reference voltages used in the sub-A/D converter circuits of the respective stages are equal to each other, when the output of the first stage sub-A/D converter circuit is changed, the outputs of the sub-A/D converter circuits of all stages are changed all at once. Thus, there has been a disadvantage that as shown in FIGS. 11A to 11D, the MDAC outputs of the respective stages are largely changed all at once, and differential nonlinear ("DNL") errors at the respective stages are added.

Figure 13:
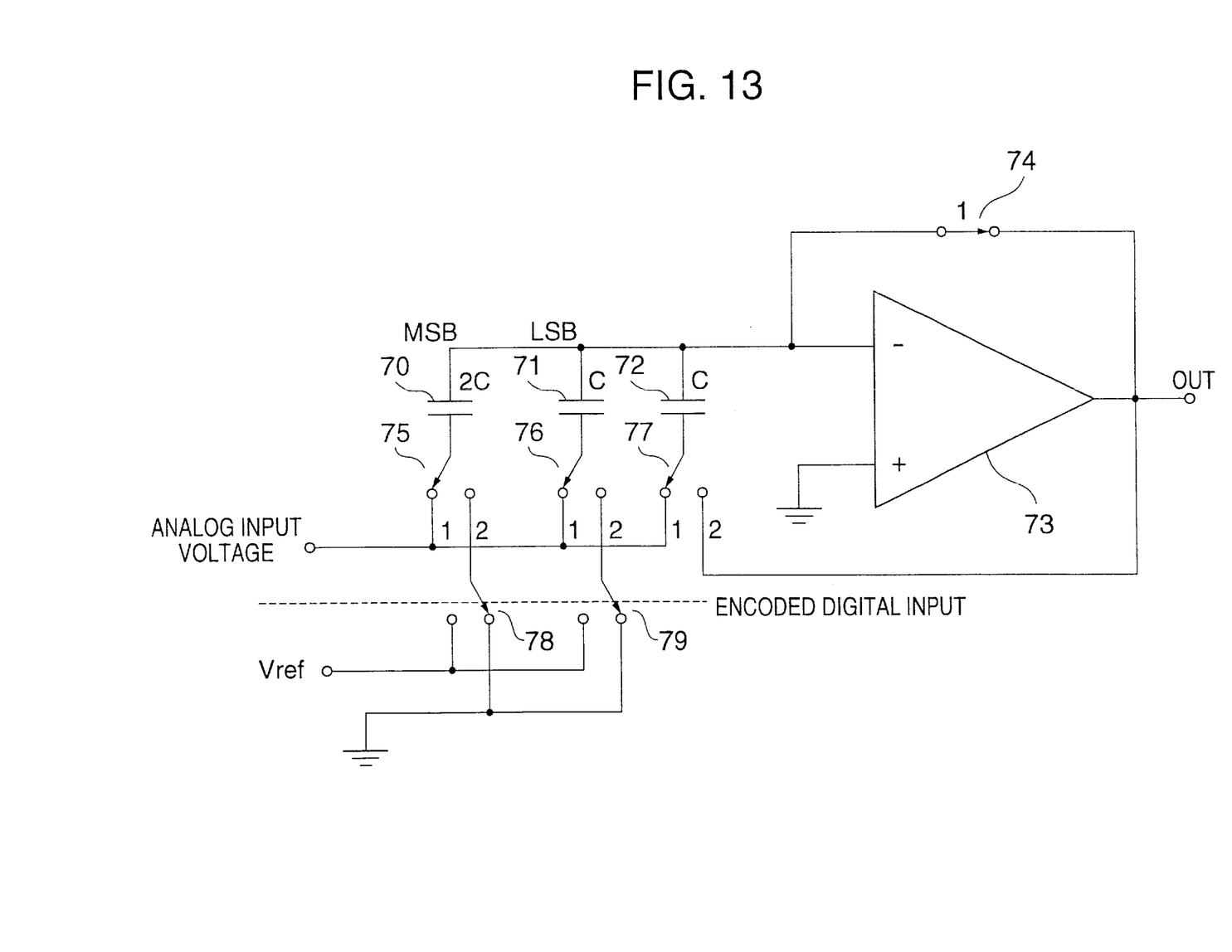
FIG. 13 is a view showing an example of an MDAC circuit.

Here, a description will be made on why a large DNL error is caused when the MDAC output is largely changed. Conventionally, there is reported an MDAC technique for outputting a voltage obtained by subtracting an analog voltage corresponding to a digital input from an input voltage. For example, a document 2: Ahn, G., Choi, H, Lim, S., Lee, S., and Lee, C., "A 12-b, 10-MHz, 250-mW CMOS A/D Converter," IEEE journal of Solid-State Circuits, pp. 2030–2035, 1996 discloses a circuit example of an MDAC. FIG. 13 shows an example of a circuit structure of a general 2-bit MDAC. The operation of this circuit becomes as follows. The 2-bit MDAC circuit operates at two clock phases 1and 2. First, at the clock phase 1, an inverting input terminal and an output terminal of an operational amplifier 73 are short-circuited by a switch 74, and a voltage of the inverting input terminal becomes nearly equal to a voltage of a noninverting input terminal, that is, a ground (GND) level (this is generally called imaginary grounding).

Capacitors 70, 71 and 72 are connected between an analog input voltage and the inverting input terminal of the operational amplifier, and the analog input voltage is sampled. Next, at the clock phase 2, the switch between the inverting input terminal and the output terminal of the operational amplifier 73 is switched off. One terminal of the two terminals of the capacitor 72 at the side where it is not connected to the inverting input terminal of the operational amplifier 73 is connected to the output of the operational amplifier 73 by a switch 77. One terminal of the two terminals of the capacitor 70 at the side where it is not connected to the inverting input terminal of the operational amplifier 73 is connected to Vref or GND by a switch 75 controlled by the MSB of a digital input of the MDAC. For example, when the MSB [bit] of the digital input of the MDAC is 1, it is connected to Vref, and when the MSB bit of the digital input of the MDAC is 0, it is connected to GND. One terminal of the two terminals of the capacitor 71 at the side where it is not connected to the inverting input terminal of the operational amplifier is connected to Vref or GND by a switch 76 controlled by the LSB bit of the digital input of the MDAC.

For example, when the LSB of the digital input of the MDAC is 1, it is connected to Vref, and when the LSB of the digital input of the MDAC is 0, it is connected to GND. At this time, the output voltage Vout of the MDAC is obtained by the following expression.

$$\text{Vout}=\text{Vin}+2(\text{Vin}-b1\ \text{Vref})+(\text{Vin}-b0\ \text{Vref})$$

Here, b1 and b0 express the MSB and the LSB of the digital input of the MDAC, respectively. Besides, it is assumed that an open loop gain of the operational amplifier 73 is infinite.

Like this, in the circuit in which the inverting input terminal of the operational amplifier is made imaginary grounding by performing negative feedback, the voltage of the output terminal is obtained with the voltage (imaginary grounding) of the inverting input terminal as the reference. Thus, as the voltage of the inverting input terminal is deviated from the GND level in an example of FIG. 13, an error at the output terminal becomes large. In an actual circuit, an open loop gain of an operational amplifier is a finite value, and a voltage variation corresponding to a value obtained by dividing a voltage of an output terminal by the open loop gain of the operational amplifier is generated at an inverting input terminal. Thus, as the voltage variation of the output terminal of the operational amplifier becomes large, the error at the output terminal becomes large. Especially, it becomes remarkable as the open loop gain of the operational amplifier becomes small.

At the respective stages, when the output of the sub-A/D converter circuit is changed, the output voltage of the MDAC is largely changed. At this time, a DNL error in the MDAC output becomes largest. In the conventional A/D converter circuit constructed as shown in FIG. 8, since the reference voltages used in the sub-A/D converter circuits of the respective stages are equal to each other, when the output of the first stage sub-A/D converter circuit is changed, the outputs of the sub-A/D converter circuits of all stages are changed all at once. Thus, the output voltages of the MDACs are also changed at the same timing.

For example, in FIG. 11B, it is assumed that at the timing (indicated by a dotted line) when the output voltage vout1 is largely changed, a DNL error of 0.8 LSB is generated since the open loop gain of the operational amplifier used for the MDAC is small. As shown in FIG. 11C, the output voltage vout2 is also largely changed at the same timing. If the magnitude of a voltage of an error generated by a large change of the output in the output voltage vout2 is equal to that in the voltage vout1, and further, if the amplification of the amplifying circuit 8 is 2, the DNL error generated in the single second stage MDAC 15 becomes 0.4 LSB of half of the DNL error generated in the single first stage MDAC 14. Thus, the DNL error in the output voltage vout2 becomes 1.2 LSB of the addition of the DNL error of 0.8 LSB generated in the single first stage MDAC 14 and the DNL error of 0.4 LSB generated in the single second stage MDAC 15.

Similarly, if the magnitude of a voltage of an error generated by a large change of the output in the output voltage vout3 is equal to that in the voltage vout1, and the amplification of the amplifying circuit 9 is 2, the DNL error generated in the single third stage MDAC 16 becomes 0.2 LSB of 1/4 of the DNL error generated in the single first stage MDAC 14. Thus, the DNL error in the output voltage vout3 becomes 1.4 LSB of the addition of the DNL error of 0.8 LSB generated in the single first stage MDAC 14, the DNL error of 0.4 LSB generated in the single second stage MDAC 15, and the DNL error of 0.2 LSB generated in the single third stage MDAC 16.

As a result, there has been a problem in that when the first stage sub-A/D converter output is changed, the MDAC outputs of the respective stages are largely changed all at once, and the DNL errors at the respective stages are added.

SUMMARY OF THE INVENTION

In order to solve the above problems, according to the present invention, in a resistance ladder circuit used for reference voltages of comparators in a sub-A/D converter, in addition to a main resistor dominating a total resistance value of the resistance ladder, an auxiliary resistor having a resistance value of half or less of that of the main resistor is used, so that an offset is formed in the input and output characteristics of sub-A/D converter circuits, and a discrepancy occurs in the input and output characteristics of a second stage or subsequent stage sub-A/D converter.

In an A/D converter circuit constructed as described above, there is a difference between the timing when the output of the first stage sub-A/D converter circuit is changed and the timing when the output of the sub-A/D converter circuit of the second stage or subsequent stage is changed. Thus, since the difference exists between the timing when the first stage MDAC output is largely changed and the timing when the second stage or subsequent stage MDAC output is largely changed, DNL errors at the respective stages are not added. Thus, since the DNL error in the entire circuit is substantially controlled by the DNL error of the first stage MDAC, the DNL error can be decreased as compared with the prior art.

In the present invention, for the purpose of causing the offset in the input and output characteristics of the first stage sub-A/D converter and the second stage or subsequent stage sub-A/D converter, in the resistance ladder circuit, in addition to the main resistor dominating the total resistance value of the resistor ladder, the auxiliary resistor having the resistance value of half or less of that of the main resistor is used, so that the input and output characteristics of the sub-A/D converter circuits are made to have the offset.

In the sub-A/D converter circuits using the thus constructed resistance ladder, the offset occurs in the input and output characteristics in the first stage sub-A/D converter circuit and the second stage sub-A/D converter, and the timing when the output of the first stage sub-A/D converter circuit is largely changed is shifted from the timing when the output of the second stage or subsequent stage MDAC is largely changed. Thus, the DNL error generated in the single second stage or subsequent stage MDAC is not added to the DNL error generated in the first stage MDAC, and the DNL error can be decreased as compared with the normal pipelined AD converter circuit.

DETAILED DESCRIPTION OF THE PREFERRED EMBODIMENTS

Embodiments of the present invention will be described below with reference to the drawings.

Figure 1:
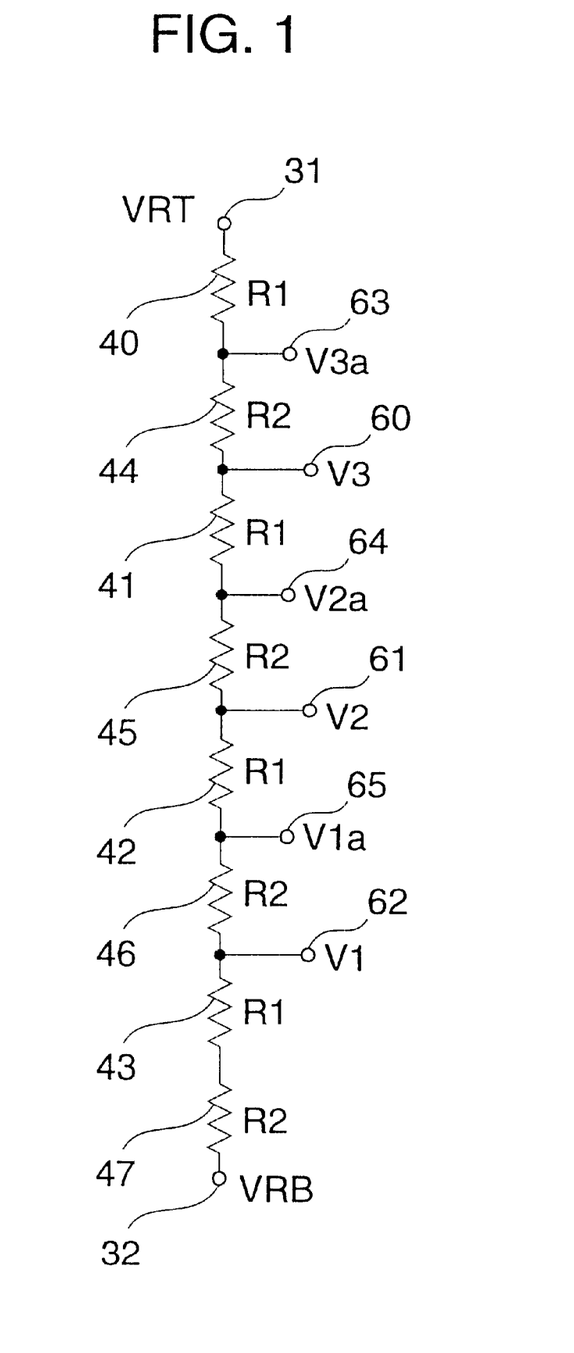
FIG. 1 is a structural view of a resistance ladder circuit of the present invention.
Figure 7:
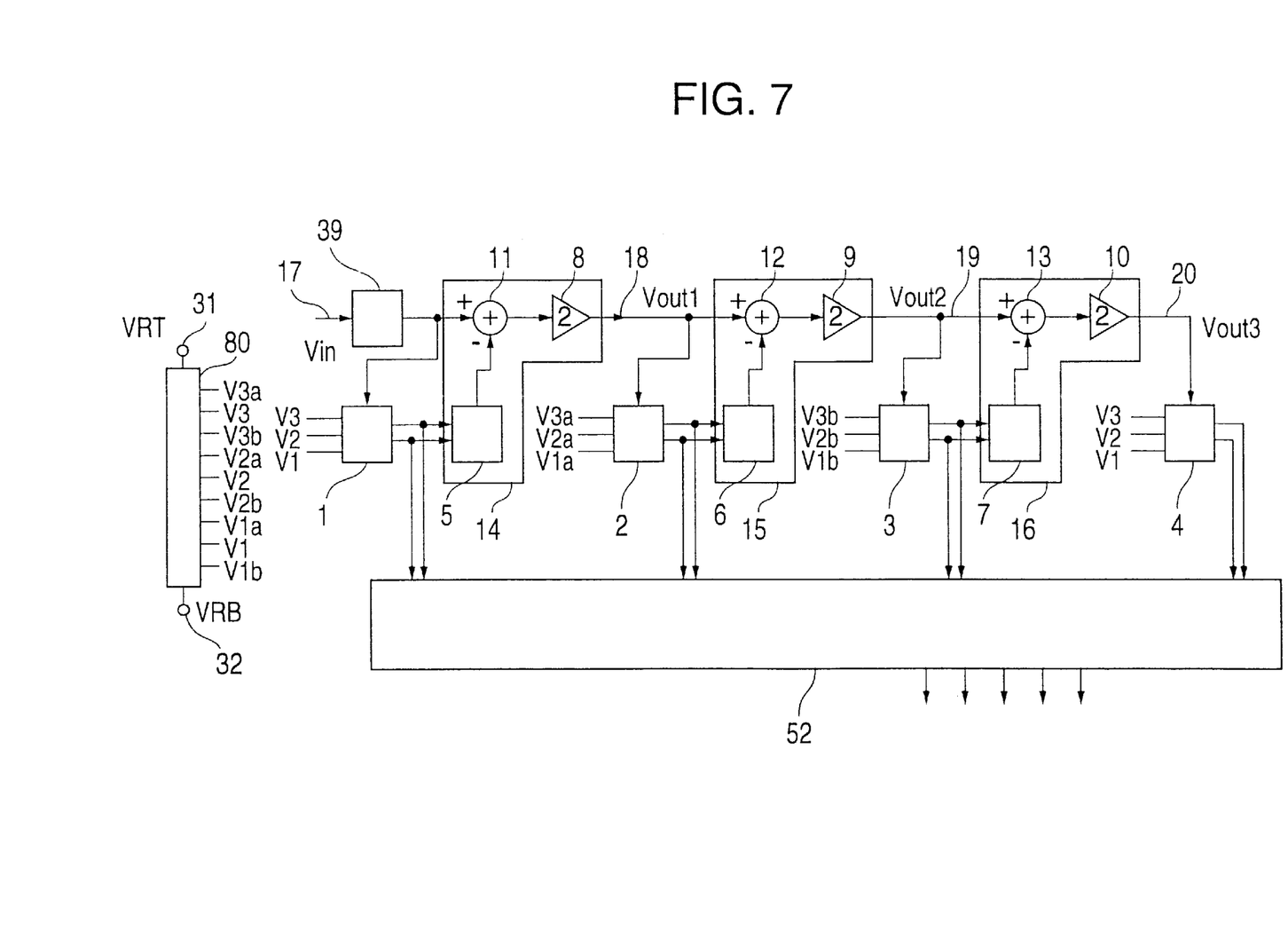
FIG. 7 is a structural view of a pipeline A/D converter circuit of the present invention.

FIG. 7 is a structural view showing an example of a pipeline A/D converter circuit of the present invention. FIG. 1 is a structural view showing an example of a resistance ladder circuit used for preparation of reference voltages of comparators of a sub-A/D converter circuit according to the present invention. This resistance ladder circuit is common to sub-A/D converter circuits 1, 2, 3 and 4 of respective stages. Main resistors 40, 41, 42 and 43 and auxiliary resistors 44, 45, 46 and 47 are alternately connected.

The respective resistors 40, 41, 42 and 43 have substantially the same resistance value. Besides, the respective auxiliary resistors 44, 45, 46 and 47 also have substantially the same resistance value. Further, the resistance value of the each of the auxiliary resistors 44, 45, 46 and 47 is made half or less of the resistance value of each of the main resistors 40, 41, 42 and 43. This is because if the resistance value of each of the auxiliary resistors 44, 45, 46 and 47 is made half or more of the resistance value of the main resistor, an error of the sub-A/D converter circuit at this stage exceeds 1 bit, and it becomes difficult to correct this error by using a digital correction circuit at a later stage. A practical value of each of the auxiliary resistors 44, 45, 46 and 47 is about 1/10 to 1/20 of the value of each of the main resistors 40, 41, 42 and 43. If the practical value is 1/10 or more, it becomes difficult to make a digital correction at a later stage, and if it is 1/20 or less, overlapping occurs in the first stage and the second stage MDACs and an error is caused. That is, the object of the present invention can not be achieved.

Figure 12:
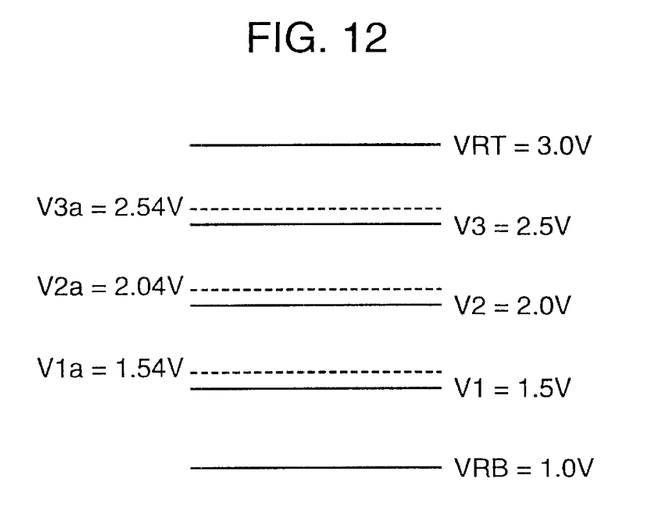
FIG. 12 is a view showing an example of standard voltages and reference voltages when a resistance ladder circuit of the present invention is used.

In this example, a resistance value R1 of the main resistor is made 460Ω, and a resistance value R2 of the auxiliary resistor is made 40Ω. FIG. 12 shows values of respective reference voltages when an upper standard voltage is 3.0 V and a lower standard voltage is 1.0 V.

Reference voltages 60, 61 and 62 are voltages obtained by dividing the voltage between the upper standard voltage and the lower standard voltage into quarters, and respectively becomes 2.5 V, 2.0 V, and 1.5 V. These are used as reference voltages of comparators of the first sub-A/D converter circuit. On the other hand, reference voltages 63, 64 and 65 have offsets by the auxiliary resistors from the reference voltages 60, 61 and 62, and respectively become 2.54V, 2.04V, and 1.54V. These are used as reference voltages of comparators of the second stage or subsequent stage sub-A/D converter circuit.

By doing so, since an offset occurs at the timing when the output of the sub-A/D converter circuit is changed, the output voltages of the MDACs of the respective stages become as shown in FIGS. 4A to 4D. By the offsets occurring between the second stage or subsequent stage reference voltages 63, 64 and 65 and the first stage reference voltages 60, 61 and 62, it is possible to shift the timing when the output voltage of the first stage MDAC is largely changed from the timing when the output voltage of the second stage or subsequent stage MDAC is largely changed. However, in this case, since the timings when the output voltages of the second stage and the third stage MDACs are largely changed are coincident with each other, the DNL error at the point where the output voltage of the second stage MDAC output voltage is largely changed and the DNL error at the point where the output voltage of the third stage MDAC is largely changed are added. However, since the sum of these DNL errors is normally smaller than the DNL error at the point where the output voltage of the first stage MDAC is largely changed, it does not become a problem.

Thus, the DNL error of the entire A/D converter can be kept at the level of the DNL error generated in the first stage MDAC.

Figure 2:
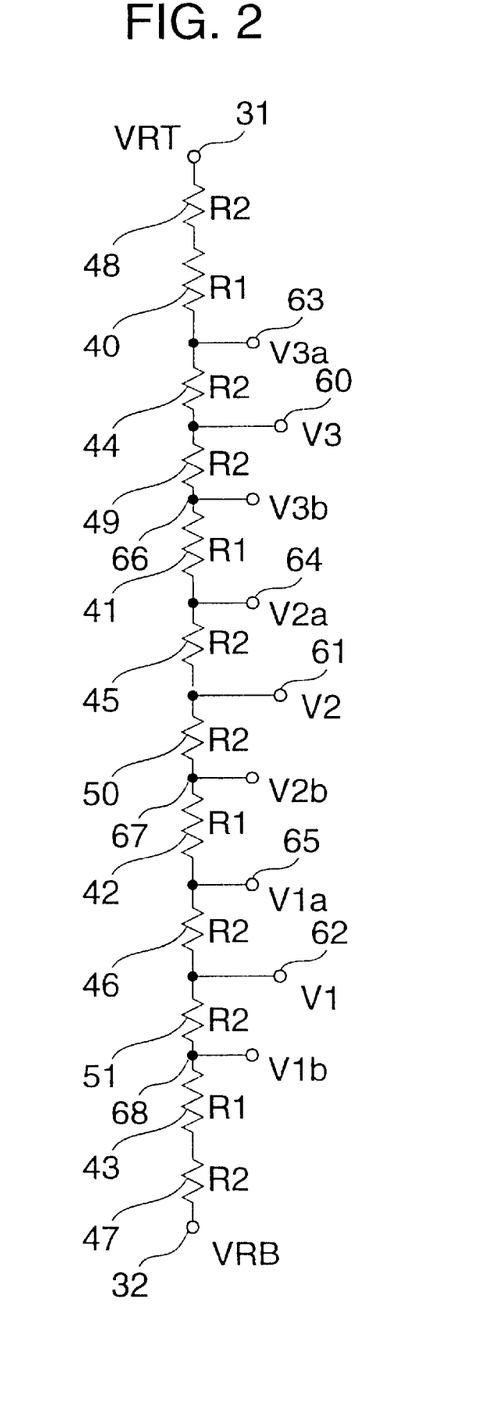
FIG. 2 is a structural view of another resistance ladder circuit of the present invention.

FIG. 2 is a structural view of another example of a resistance ladder circuit used for preparation of reference voltages of comparators of a sub-A/D converter circuit according to the present invention. A reference value R1 of a main resistor was made 460Ω, and a reference value R2 of an auxiliary resistor was made 20Ω. This resistance ladder circuit is common to the sub-A/D converter circuits 1, 2, 3 and 4 of the respective stages. In addition to the circuit of FIG. 1, auxiliary resistors 48, 49, 50 and 51 are further connected. That is, two auxiliary resistors each having a resistance value of half or less of that of a main resistor are used as a set for one main resistor, so that not only an offset occurs in the input and output characteristics at the first stage and the second stage, but also an offset can also be made to occur in the input and output characteristics at the second stage and the third stage or the subsequent stages, which is further effective.

Reference voltages 60, 61, and 62 of the comparators of the first stage sub-A/D converter circuit. On the other hand, reference voltages 63, 64 and 65 are used as reference voltages of the comparators of the second stage sub-A/D converter circuit. Besides, reference voltages 66, 67, and 68 are used as reference voltages of the comparators of the third stage sub-A/D converter circuit. By doing so, the output voltages of the MDACs of the respective stages become as shown in FIGS. 5A to 5D, and all timings when the output voltages of the first stage, second stage and third stage MDACs are largely changed can be made inconsistent with one another. Thus, since the timings when the DNL errors of the MDAC outputs at the respective stages become largest are inconsistent with one another, the DNL error of the entire A/D converter can be kept the level of the DNL error generated in the first stage MDAC.

Figure 3:
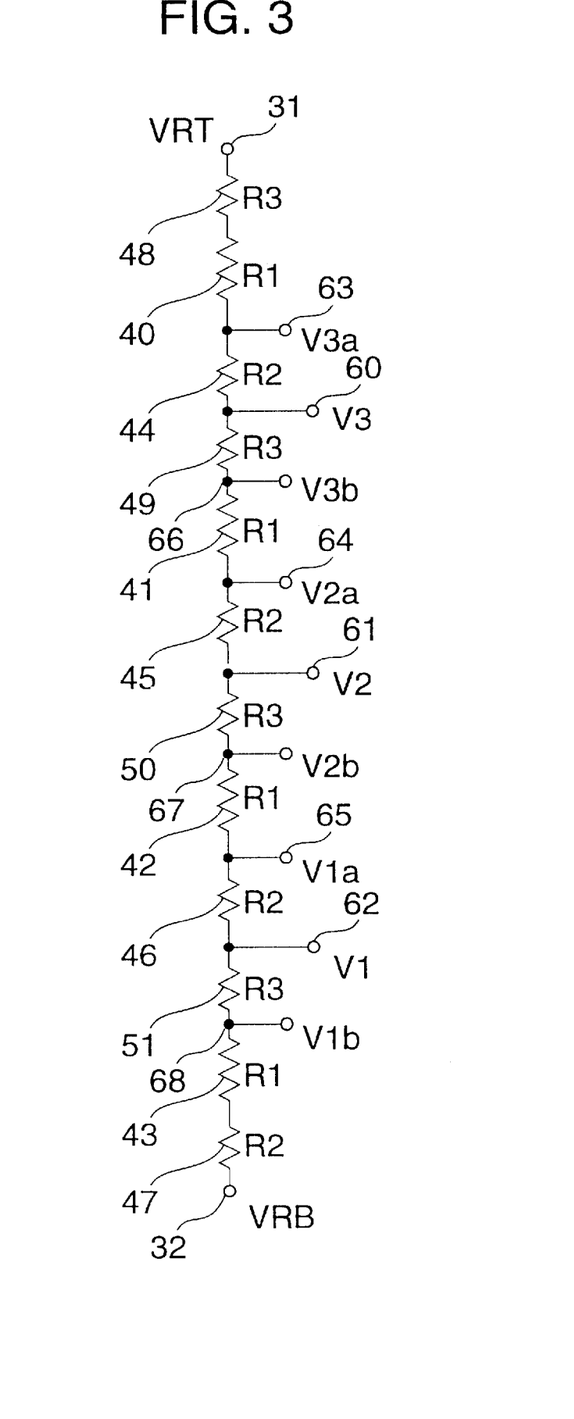
FIG. 3 is a structural view of still another resistance ladder circuit of the present invention.
Figure 4A:
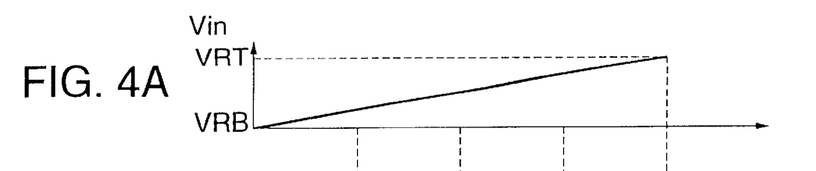
FIGS. 4A to 4D are timing charts showing output voltages of MDACs of respective stages in a pipeline A/D converter circuit using a resistance ladder circuit of the present invention and an input voltage to the A/D converter circuit.
Figure 4B:
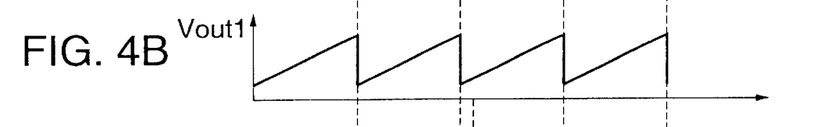
Figure 4C:
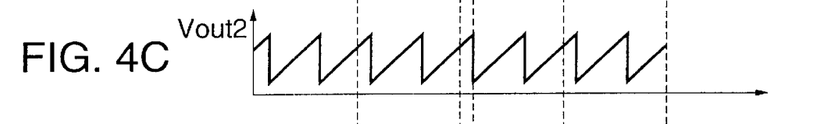
Figure 4D:
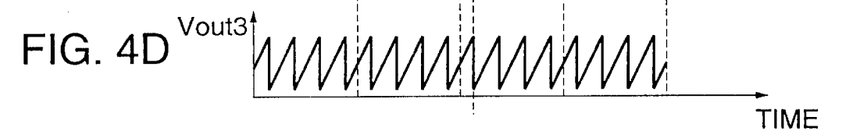
Figure 5A:
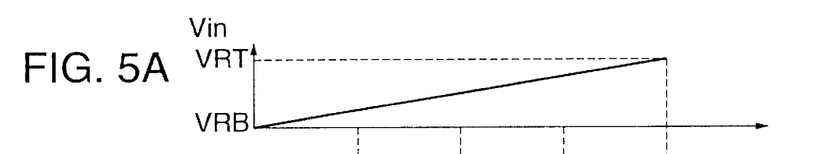
FIGS. 5A to 5D are timing charts showing output voltages of MDACs of respective stages in a pipeline A/D converter circuit using another resistance ladder circuit of the present invention and an input voltage to the A/D converter circuit.
Figure 5B:
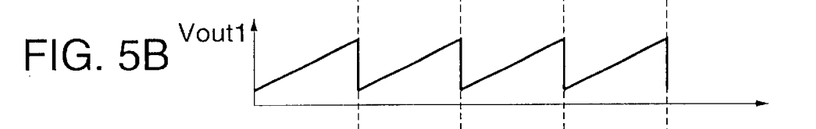
Figure 5C:
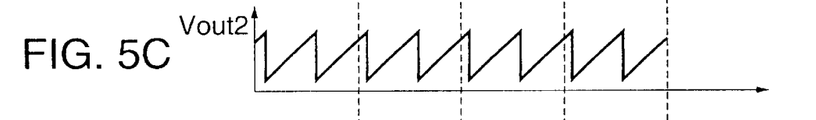
Figure 5D:
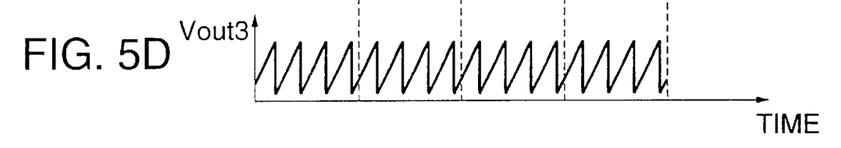
Figure 6A:
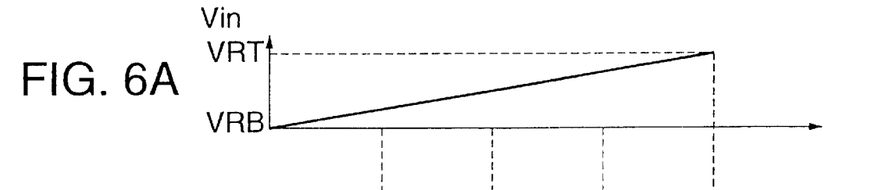
FIGS. 6A to 6D are timing charts showing output voltages of MDACs of respective stages in a pipeline A/D converter circuit using still another resistance ladder circuit of the present invention and an input voltage to the A/D converter circuit.
Figure 6B:
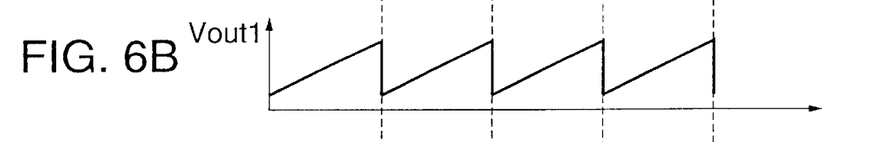
Figure 6C:
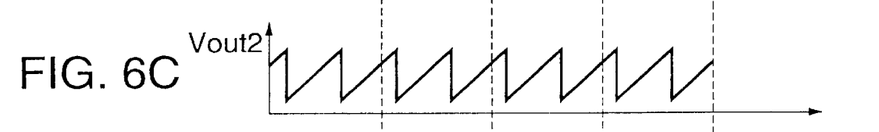
Figure 6D:
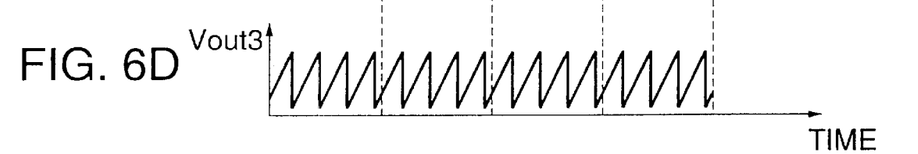

FIG. 3 shows still another example of a resistance ladder circuit in which a resistance value R1 of a main resistor is made 470Ω, a resistance value R2 of an auxiliary resistor is made 20Ω, a resistance value R3 of an auxiliary resistor is made 10Ω, and the resistors are connected in the order of the resistors R1, R2 and R3. Auxiliary resistors 48, 49, 50 and 51 have the resistance value R3.

In this embodiment, although the description has been made on the pipeline structure in which three MDACs are cascaded and connected, the present invention is not limited to this, but can be applied to a case where two or more MDACs are used.

As described above, according to the circuit system of the present invention, since there is a difference in the timings when the MDAC outputs of the respective stages are largely changed, the DNL errors at the respective stages are not added. Thus, the DNL error of the entire A/D converter circuit can be kept the level of the DNL error generated at the first stage.

What is claimed is:

1. An A/D converter circuit comprising: a plurality of cascaded sub-A/D converter stages; and a resistance ladder circuit for providing reference voltages to the sub-A/D converter stages, the resistance ladder circuit comprising a plurality of main resistors, and a plurality of auxiliary resistors each connected in series to a respective main resistor and having a resistance value no more than one-half that of the respective main resistor, the main resistors and the auxiliary resistors being alternately connected in series between two reference voltage terminals.

2. An A/D converter circuit according to claim 1; wherein the auxiliary resistors each comprise a plurality of resistors having different resistance values.

3. A pipeline type A/D converter circuit comprising:
   a plurality of sub-A/D converter blocks, each including a sub-A/D converter and a multiplying D/A converter, the blocks being connected to each other in a cascading manner; and
   a resistance ladder circuit connected between two reference voltage terminals and having a plurality of resistors connected in series with each other to supply reference voltages to the sub-A/D converter, including a plurality of main resistors and a plurality of auxiliary resistors each having a resistance value of no more than one-half that of the main resistors, the main resistors and the auxiliary resistors being alternately connected in series between the two standard voltage terminals, and the reference voltages being obtained from connection points between the main resistors and the auxiliary resistors.

4. A pipeline type A/D converter circuit comprising:
   a plurality of sub-A/D converter blocks, each including a sub-A/D converter and a multiplying D/A converter, the blocks being connected to each other in a cascading manner; and
   a resistance ladder circuit connected between two reference voltage terminals and having a plurality of resistors connected in series with each other to supply reference voltages to the sub-A/D converter, including a plurality of resistor groups, each group having a main resistor and auxiliary resistors each having a resistance value no more than one-half that of the main resistor and being connected to opposite ends of the main resistor, the plurality of resistor groups being connected in series between the two reference voltage terminals, and the reference voltages being obtained from connection points between the resistors.

5. An A/D converter circuit comprising: a plurality of cascaded sub-A/D converter stages; and a resistance ladder circuit for providing reference voltages to the sub-A/D converter stages, the resistance ladder circuit comprising a plurality of resistor groups, each group having a main resistor and two or more auxiliary resistors each having a resistance value of no more than one-half that of the main resistor and being connected to opposite ends of the main resistor, the plurality of resistor groups being connected in series with each other between two reference voltage terminals.

6. An A/D converter circuit according to claim 1; wherein the main resistors each have substantially the same resistance value.

7. An A/D converter circuit according to claim 6; wherein the auxiliary resistors each have substantially the same resistance value.

8. An A/D converter circuit according to claim 1; wherein the auxiliary resistors have a resistance value within a range of about 1/20 to 1/10 that of the respective main resistor.

9. A pipeline type A/D converter circuit according to claim 3; wherein respective stages of sub-A/D converter blocks are supplied with different reference voltages from the resistor ladder circuit so that outputs of the respective stages reach a maximum value at different times.

10. An A/D converter circuit according to claim 3; wherein the main resistors each have substantially the same resistance value and the auxiliary resistors each have substantially the same resistance value.

11. A pipeline type A/D converter circuit according to claim 4; wherein respective stages of sub-A/D converter blocks are supplied with different reference voltages from the resistor ladder circuit so that outputs of the respective stages reach a maximum value at different times.

12. An A/D converter circuit according to claim 4; wherein the main resistors each have substantially the same resistance value and the auxiliary resistors each have substantially the same resistance value.

13. An A/D converter circuit comprising: one or more cascade-connected A/D converter stages; a resistor ladder circuit for providing reference voltages to each A/D converter stage and comprising a plurality of resistor groups, each group comprising a main resistor and one or more auxiliary resistors each having a resistance value no more than one-half that of the main resistor, the resistor groups being connected in series with each other and the reference voltages being output from nodes between series-connected resistors.

14. An A/D converter circuit according to claim 13; wherein the main resistors each have substantially the same resistance value and the auxiliary resistors each have substantially the same resistance value.

15. An A/D converter circuit according to claim 13; wherein the A/D converter stages each comprise a sub-A/D converter and a multiplying D/A converter connected to one another.

16. An A/D converter circuit according to claim 15; wherein the sub-A/D converter comprises a plurality of comparators each for receiving an analog input voltage to be converted to a digital value and a reference voltage produced by the resistor ladder circuit and producing a comparison output signal based on the difference therebetween, and an encoder circuit for receiving the comparison output signals of the comparators and producing a digital output according to the comparison output signals.

17. An A/D converter circuit according to claim 13; wherein respective A/D converter stages are supplied with different reference voltages so that outputs of the respective stages reach a maximum value at different times.

18. An A/D converter circuit according to claim 13; wherein the auxiliary resistors each comprise two or more resistors connected in series between a pair of main resistors.

19. An A/D converter circuit according to claim 18; wherein the two or more resistors have the same resistance value.

20. An A/D converter circuit according to claim 18; wherein the two or more resistors have different resistance values.

* * * * *